United States Patent [19]

Takaoka et al.

[11] Patent Number: 4,584,025
[45] Date of Patent: Apr. 22, 1986

[54] PROCESS FOR FABRICATING A SEMICONDUCTOR ON INSULATOR SEMICONDUCTOR DEVICE

[75] Inventors: Matsuo Takaoka, Koganei; Nobuo Sasaki, Kawasaki; Seiichiro Kawamura, Tokyo; Osamu Hataishi, Yokohama, all of Japan

[73] Assignee: Fujitsu Limited, Kawasaki, Japan

[21] Appl. No.: 674,831

[22] Filed: Nov. 26, 1984

[30] Foreign Application Priority Data

Nov. 30, 1983 [JP] Japan ................. 58-225653

[51] Int. Cl.[4] .......................... H01L 21/388
[52] U.S. Cl. ................. 148/1.5; 29/576 F; 148/175; 148/188; 148/171; 156/605
[58] Field of Search ............. 148/188, 171, 1.5, 175; 156/605; 29/576 E

[56] References Cited

U.S. PATENT DOCUMENTS

| 4,269,631 | 5/1981 | Anantha et al. | 148/1.5 |
|---|---|---|---|
| 4,270,960 | 6/1981 | Bollen et al. | 148/175 |
| 4,323,417 | 4/1982 | Lam | 148/171 X |
| 4,323,913 | 4/1982 | Murrmann et al. | 148/175 X |
| 4,346,513 | 8/1982 | Nishizawa et al. | 148/175 X |
| 4,385,937 | 5/1983 | Ohmura | 148/175 X |
| 4,395,433 | 7/1983 | Nagakubo et al. | 148/175 X |
| 4,425,700 | 1/1984 | Gasaki et al. | 148/175 X |
| 4,498,951 | 2/1985 | Tamura et al. | 148/175 X |
| 4,504,332 | 3/1985 | Shinada | 148/188 X |
| 4,528,745 | 7/1985 | Muraoka | 148/188 X |
| 4,542,580 | 9/1985 | Delivorias | 148/188 X |
| 4,543,133 | 9/1985 | Mukai | 148/175 X |

OTHER PUBLICATIONS

Appl. Phys. Lett. 40(5), "Recrystallization of Si on Amorphous Substrates by Doughnut-Shaped CW Ar Laser Beam", Kawamura et al., Mar. 1, 1982, pp. 394–395.

IEEE Electron Device Letters, "Three-Dimensional CMOS IC's Fabricated by Using Beam Recrystallization", Kawamura et al., vol. EDL-4, No. 10, 10/83, pp. 366–368.

ECS Meeting, Abstract, "Laser-Induced Lateral Epitaxial Growth of Si over $SiO_2$", Kawamura et al., May 1982, p. 243, Montreal, Canada.

Primary Examiner—George T. Ozaki
Attorney, Agent, or Firm—Staas & Halsey

[57] ABSTRACT

A process for fabricating a substrate having a dielectrically isolated region, using energy beam recrystallization. An island of polysilicon is formed on an insulating substrate and a cap containing a dopant is coated on the entire surface of the substrate. A laser beam is irradiated through the cap, and the polysilicon is recrystallized to form a doped first single crystal silicon layer. A second single crystal silicon layer is grown over the first single crystal layer. The first single crystal layer is used as a buried layer, and a semiconductor device is fabricated in the second single crystal layer. This process avoids the existence of crystal imperfections at the boundaries of the single crystal layers.

22 Claims, 27 Drawing Figures

PROCESS FOR FABRICATING A SEMICONDUCTOR ON INSULATOR SEMICONDUCTOR DEVICE

BACKGROUND OF THE INVENTION

1. Field of the Invention

The present invention is related to a process for fabricating a SOI (Semiconductor On Insulator) type semiconductor device, and more particularly to a process for fabricating monocrystalline silicon islands embedded in a substrate of insulator using a polycrystalline silicon recrystallization technique which employs an energy beam. The present invention is intended to simplify the process to prepare a substrate used for SOI structured devices.

2. Description of the Prior Art

There has been an increased demand for SOI type semiconductor devices or dielectrically isolated integrated circuits (IC), which isolate circuit elements (such as transistors and diodes) from each other by insulating material, due to the advantages of low stray capacitance and high breakdown voltage. The substrate used for fabricating such devices has a structure in which single crystal semiconductors are embedded in the substrate like islands and surrounded at their peripheries and bottoms by an insulating material.

Recently, a technique for recrystallizing polycrystalline silicon (polysilicon) by irradiating an energy beam (such as a laser beam) has been developed. This technique is starting to be applied in the fabrication of SOI types devices. Further details of this technology are disclosed in, for example, Applied Physics Letter 40(5), Mar. 1, 1982: "Recrystallization of Si on Amorphous Substrates by Doughnut-shaped CW Ar Laser Beam" by S. Kawamura et al.; and IEEE ED Letters, Vol. EDL-4, No. 10, October 1983: "Three-Dimensional CMOS IC's Fabricated by Using Beam Recrystallization" by S. Kawamura and N. Sasaki et al.

To clarify the advantages of the present invention over the prior art, a prior process for preparing insulated substrates, as illustrated in FIG. 1, will be described briefly. FIG. 1 is a schematic partial cross-sectional view of the substrate, illustrating the steps in the fabrication process. A silicon dioxide ($SiO_2$) film 2 of 0.5 μm thickness is grown on a silicon substrate 1 and is patterned as shown in FIG. 1(a). The size and position of each film pattern 2 correspond to the size and position of the isolated regions which are to be grown later. The film 2 is patterned by conventional photolithographic and etching processes.

Figure 1A:
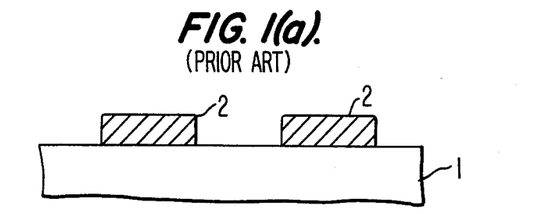
Figure 1B:
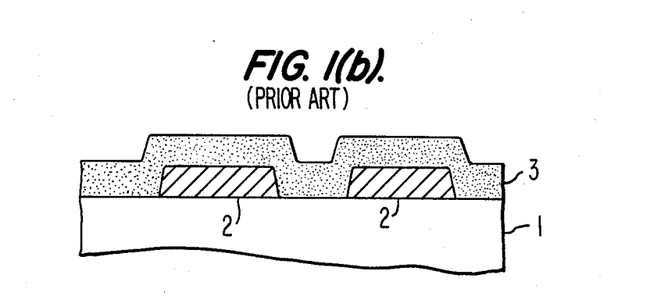

Next, a polysilicon layer 3, having a thickness of 0.8–1.0 μm, is grown over the entire surface of the substrate (FIG. 1b).

Figure 1C:
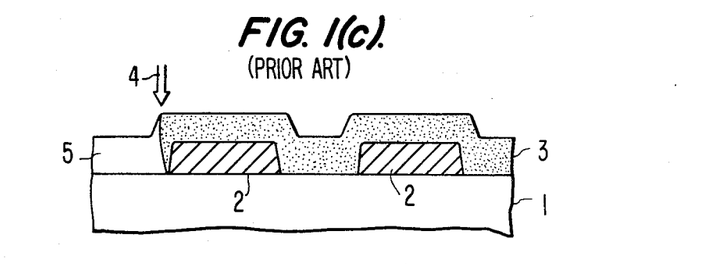
Figure 1D:
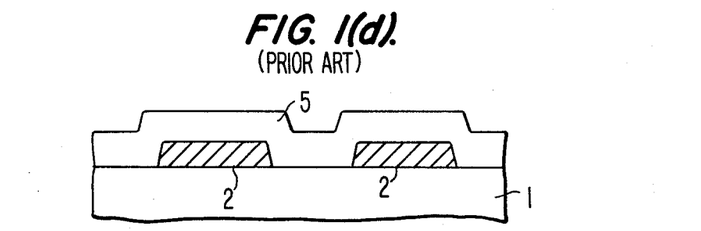

As illustrated in FIG. 1(c), the surface of the substrate is irradiated using a laser beam 4. The irradiation is first performed on a portion of the substrate where the pattern 2 is not present. As a result, the portion of the polysilicon layer 3 irradiated by the laser beam 4, is melted and recrystallized to form a single crystal of silicon having a crystal orientation which is similar to that of the substrate. As the laser beam 4 is moved gradually to the right in the figure (FIG. 1(c)), the single crystal silicon grows to the right with the shift of the beam. Finally, the polysilicon layer 3 covering the entire surface of the substrate is converted to a single crystal silicon layer 5 as shown in FIG. 1(d). Such growth of a single crystal is referred to as lateral epitaxial growth, and is disclosed in, for example, ECS Meeting Montreal, Canada, May 1982, "Laser-Induced Lateral Epitaxial Growth of Si over $SiO_2$" by S. Kawamura et al.

Figure 1E:
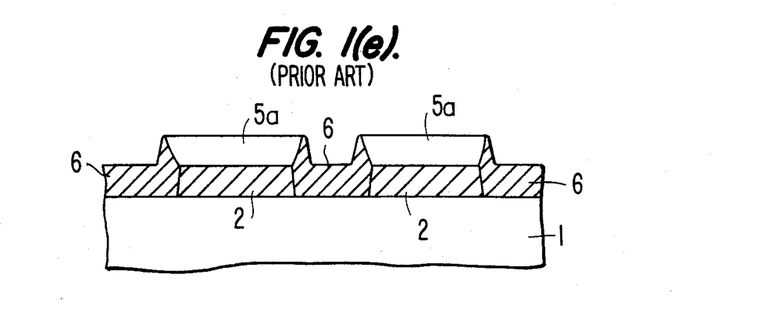

Next, the portion of the single crystal silicon layer 5 over the pattern 2 is coated by a protective film (for example, silicon nitride ($Si_3N_4$) film) (not shown), and the substrate is oxidized. As a result, as illustrated in FIG. 1(e), the exposed portion of the single crystal silicon layer 5 (i.e., the portion not covered by the protective film) is converted to a $SiO_2$ film 6, and an island-like single crystal silicon portion 5a is formed, which is surrounded by $SiO_2$.

A substrate prepared in the manner described above is used for fabricating various types of devices such as complementary high voltage devices, and has its own advantages. However, when the substrate is used for certain applications (e.g., in bipolar devices), it is necessary to prepare a buried layer in the substrate, as in ordinary bipolar devices. Further, in some high voltage applications, the crystallization at the boundary portion of the single crystal silicon island 5a is imperfect. Therefore, there has been a need in the art for some improvement or expansion of the prior art process (for example, U.S. patent application Ser. No. 604,719, filed Apr. 27, 1984, now U.S. Pat. No. 4,543,133 by R. Mukai et al.) to overcome such problems.

SUMMARY OF THE INVENTION

A principal object of the present invention is to provide an improved process for fabricating a SOI type semiconductor device.

Another object of the present invention is to provide a process for preparing a SOI substrate (i.e., a substrate which has isolated single crystal regions embedded in insulator, and which is used for SOI type devices) which is provided with a buried layer.

A further object of the present invention is to provide a process for preparing a SOI substrate which is properly doped for fabricating devices in the isolated regions.

Still another object of the present invention is to provide a process for preparing a SOI substrate which is not affected by imperfect crystallization at the boundary of the isolated single crystal.

The foregoing objects are attained by covering a polycrystalline layer with a "cap", and doping the cap with an appropriate dopant. The dopant is then diffused into the single crystal while the single crystal is being grown through irradiation of a laser beam.

The process of the present invention can be modified or extended for the fabrication of various types of devices. For example, the process of the present invention can be modified to provide several methods for fabricating a bipolar transistor.

The process of the present invention also provides methods for avoiding crystal imperfections at the border of the single crystal. One method is to open a window apart from the border of the crystal, and use the center part of the single crystal for forming the device. Another method is to cover the side walls of the single crystal with high quality silicon dioxide film. To do so, the $SiO_2$ layer surrounding the single crystal regions is removed, the exposed side walls of the single crystal regions are oxidized, and the $SiO_2$ layer is regrown.

These together with other objects and advantages, which will be subsequently apparent, reside in the details of construction, as more fully hereinafter described and claimed, reference being had to the accompanying drawings forming a part hereof, wherein like numerals refer to like parts throughout.

BRIEF DESCRIPTION OF THE DRAWINGS

FIG. 1 is a schematic partial cross-sectional view of a SOI substrate, wherein FIGS. 1(a) through 1(e) illustrate several steps of a prior art process for fabricating the SOI substrate;

FIGS. 6(a) through 6(c) illustrate the steps of a third embodiment of the present invention in which the adverse effects of the crystal imperfection are prevented by opening a window 64 inside the peripheral part of a single crystal region 62a.

DESCRIPTION OF THE PREFERRED EMBODIMENTS

The present invention will be described with respect to the preferred embodiments with reference to the accompanying drawings.

Figure 2A:
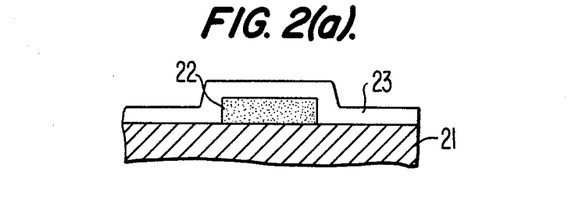
FIGS. 2(a) through 2(e) illustrate the steps of a first embodiment of a process in accordance with the present invention for fabricating a SOI substrate, wherein a buried layer 22a is formed in the isolated single crystal region.

FIGS. 2(a) through 2(e) illustrate the steps of a first embodiment of a process in accordance with the present invention, for fabricating a substrate used for SOI type semiconductor devices (SOI substrate). In the process, a polysilicon layer 22 having a thickness of approximately 1 μm, is grown on an insulating layer 21 (FIG. 2(a)). The insulating layer 21 is usually a silicon dioxide layer grown on a silicon substrate (not shown). Alternatively, the substrate may be a sapphire substrate. The polysilicon layer 22 is patterned according to the shape and size of the device to be fabricated, as shown in FIG. 2(a). Then the entire surface of the substrate is coated with an insulating film 23 having a thickness of approximately 1 μm. The insulating film 23 is preferably transparent and contains a dopant of the desired conductivity type. For example, the film 23 is preferably phosphosilicate glass (PSG) when an n-type dopant of phosphorus is to be used. The processes of growing and patterning the layers 21, 22 and 23 are all conventional processes for semiconductor device manufacturing, including, for example, oxidation, chemical vapor deposition (CVD), photolithographic etching, etc.

The insulating film 23 is referred to in the art as a "cap". It is known in the art that when a laser beam is irradiated through the cap, it decreases the reflection of the laser beam and increases the beam efficiency. Moreover, the cap acts as an insulation jacket which protects the crystal, prevents uneven crystallization, and provides a flat recrystallized surface. A more detailed discussion of laser crystallization with a cap is presented in, for example, Applied Physics Letters, 40(5), Mar. 1, 1982: "Recrystallization of Si on Amorphous Substrates by Doughnut-shaped CW Ar Laser Beam" by S. Kawamura et al., the contents of which is hereby incorporated by reference.

Figure 2B:
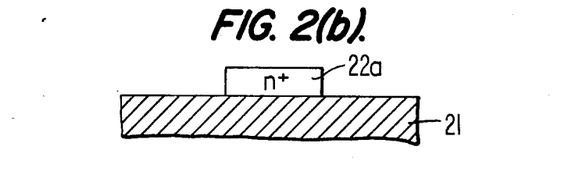

In the first embodiment, a laser beam having approximately 10 watts of continuous beam energy, is irradiated on the polysilicon layer 22, through the PSG film 23. The polysilicon layer 22 is annealed by the laser beam and is converted to a single crystal layer 22a. At the same time the recrystallized silicon 22a is doped with phosphorus and becomes a highly doped $n^+$-type single crystal. FIG. 2(b) illustrates the state of the substrate after the PSG layer 23 has been washed out. In the present invention, the silicon layer 22a (hereinafter referred to as the first single crystal layer) is employed as a buried layer.

Figure 2C:
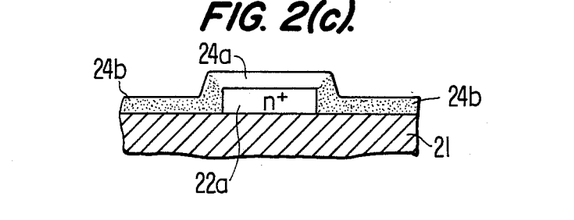

Next, a silicon layer having a thickness of approximately 3 μm, is epitaxially grown over the entire surface of the substrate. The thickness of the epitaxial layer depends upon the device to be fabricated in the recrystallized and epitaxially grown silicon layer. For example, if bipolar devices are to be fabricated the thickness must be relatively great, and if MOS type devices are to be fabricated the thickness may be relatively small. By this epitaxial growing process, a single crystal layer 24a (hereinafter referred to as the second single crystal layer) is grown over the first single crystal layer 22a, and a polycrystalline silicon (polysilicon) layer 24b is grown over the $SiO_2$ layer 21, as shown in FIG. 2(c). This process is known and used widely in the art, and therefore the process will not be described in detail herein.

Figure 2D:
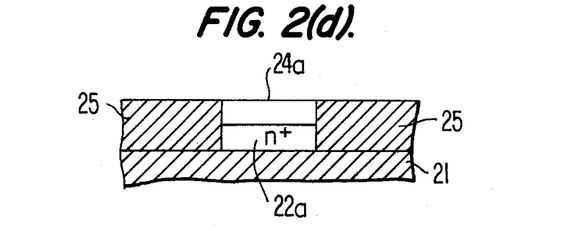

Next, as shown in FIG. 2(d), the polysilicon layer 24b is etched off, and a new insulation layer 25 is grown. The insulation layer 25 may be a $SiO_2$ layer, which may be grown by the chemical vapor deposition (CVD) method for example, and the surface is polished to expose the second single crystal layer 24a. Thus, a single crystal silicon layer 24a is fabricated having a highly doped buried layer 22a beneath it, and surrounded by an insulator 25.

Figure 2E:
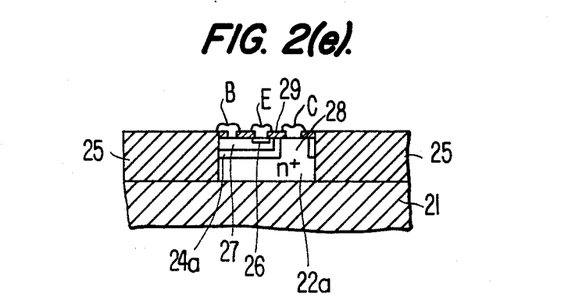

As illustrated in FIG. 2(e), an emitter region 26, a base region 27, and a collector contact region 28 are formed in the second single crystal layer 24a. The second single crystal layer 24a is utilized as the collector region, and the symbols E, B and C designate an emitter electrode, a base electrode and a collector electrode, respectively. A $SiO_2$ film 29 is formed to protect the surface. The emitter, base and collector contact regions, and the $SiO_2$ film 29 are fabricated by a conventional method, so that a dielectrically isolated transistor is formed.

In the first embodiment, the cap material 23 is not limited to PSG, and another insulating layer, such as antimonic-silicate glass (SbSG), may be used instead. Further, the circuit element which is fabricated in the isolated epitaxial region 24a is not limited to a bipolar transistor. Other devices, such as diodes, MOS transistors or any other type of device, can be fabricated by using the appropriate method.

Figure 3A:
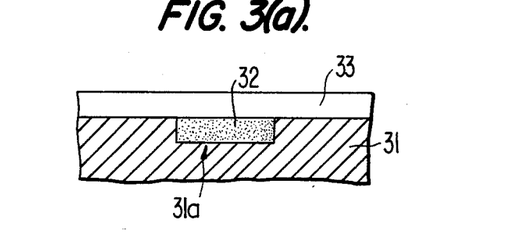
FIGS. 3(a) through 3(c) illustrate the steps of a modification of the embodiment of the process of the present invention illustrated in FIG. 2, wherein a polysilicon region 32 is embedded in a $SiO_2$ layer 31.
Figure 3B:
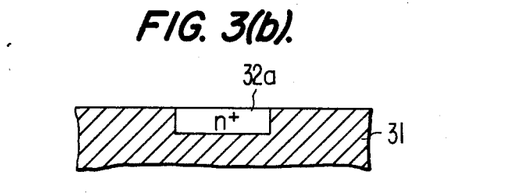
Figure 3C:
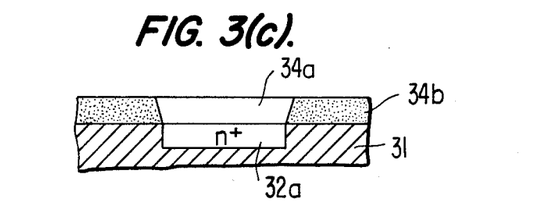

The process of the present invention may be modified to make it suitable for various applications. For example, although in the embodiment illustrated in FIG. 2, the process employs a polysilicon layer 22 patterned on an insulating layer 21, the process can be modified to employ a polysilicon layer 32 which is embedded in an insulating layer 31, as illustrated in FIGS. 3(a) through 3(c). In FIG. 3(a) a polysilicon layer 32 is formed in a depression 31a engraved in a SiO₂ layer 31. The process steps illustrated in FIGS. 3(a) through 3(c) are similar to those illustrated in FIG. 2. In particular, a PSG layer 33 is coated over the entire surface of the substrate, and by laser recrystallization, the polysilicon layer 32 is crystallized to form a highly doped (n+-type) first single crystal layer 32a (FIG. 3(b)). Next, a silicon layer is grown epitaxially over the entire surface of the substrate. By this epitaxial growth step, a second single crystal layer 34a is grown over the first single crystal layer 32a, and a polysilicon layer 34b is grown over the remaining surface of the substrate, as shown in FIG. 3(c). Such epitaxial growth is referred to as selective epitaxial growth and is widely used in semiconductor production. When the polysilicon layer 34b is removed, and a SiO₂ layer is grown, the substrate becomes equivalent to that illustrated in FIG. 2(d). Alternatively, the polysilicon layer 34b may be oxidized to obtain the substrate illustrated in FIG. 2(d). Then the process described with respect to FIG. 2 can be followed to obtain the desired device.

Figure 4A:
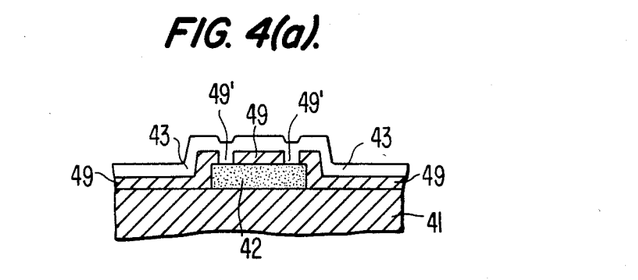
FIGS. 4(a) and 4(b) illustrate an application of the process described in FIG. 2, wherein a single crystal region 42a is doped in a predetermined pattern.
Figure 4B:
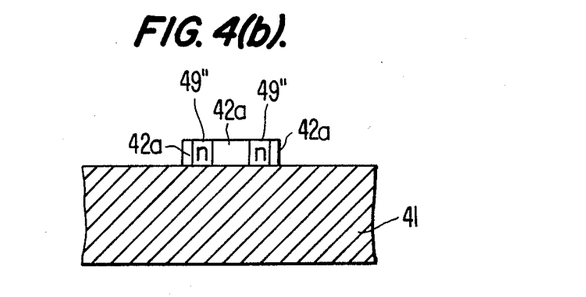

An application of the process of the present invention is illustrated in FIG. 4. In this application, a recrystallized silicon layer 42a is doped with an appropriate doping profile in a predetermined pattern. As illustrated in FIG. 4(a), before coating a polysilicon region 42 with a PSG cap 43, the entire surface is coated with a SiO₂ film 49 having a thickness of approximately 0.1–0.2 μm. Holes 49' having the same size and shape as the size and shape of the regions to be doped, are formed in respective positions of the SiO₂ film 49. The forming and patterning of the SiO₂ film 49 can be carried out by conventional CVD and photolithographic processes. Then the PSG film (cap) 43 is coated on the substrate 41 as shown in FIG. 4(a). When laser recrystallization is performed through the PSG cap 43 and the SiO₂ mask 49, the recrystallized silicon layer 42a is doped as shown in FIG. 4(b). FIG. 4(b), which shows the state after the PSG cap 43 and the SiO₂ film 49 have been removed, illustrates phosphorus doped regions 49''. The steps which are performed thereafter are similar to those illustrated in FIGS. 2(c) through 2(e). This process is applicable for fabricating, for example, a well region for complementary devices.

The second embodiment of the present invention is employed for fabricating a bipolar transistor in a recrystallized silicon region, utilizing the highly doped region fabricated by SOI technology as a buried layer. The second embodiment will be described with reference to FIGS. 5(a) through 5(e).

Figure 5A:
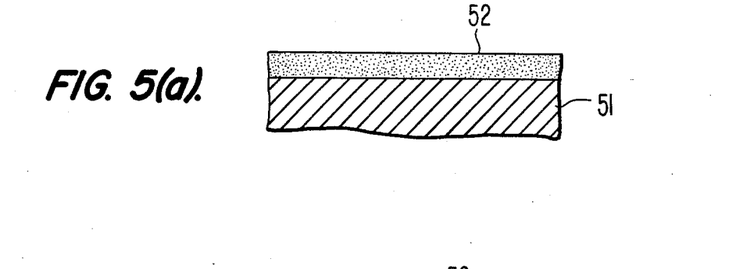
FIGS. 5(a) through 5(e) illustrate the steps of a second embodiment of the process of the present invention in which an isolated single crystal region 54 having a buried layer 52a, is fabricated.

As illustrated in FIG. 5(a), a polysilicon layer 52 having a thickness of about 1 μm, is grown over an insulating substrate 51, and is patterned to a predetermined form. Typically, the insulating substrate 51 is formed of silicon dioxide (SiO₂) or sapphire, and the polysilicon layer 52 is grown by chemical vapor deposition (CVD) and patterned using photolithography. Then antimony (Sb) is doped by ion implantation at a dosage of $1 \times 10^{16}$/cm² with a beam energy of 100 Kev. Next, the polysilicon layer 52 is laser annealed with a YAG laser at 5–10 J/cm² and recrystallized to form a single crystal layer 52a (FIG. 5(b)).

Figure 5B:
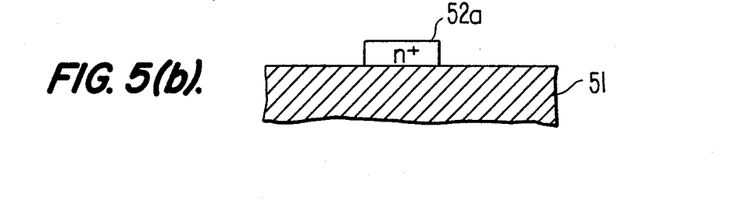

The above process can be modified in various ways. For example, the polysilicon layer 52 may be coated over the substrate 51, laser annealed, and then doped with n+-type dopant and patterned. Alternatively, the polysilicon layer 52 may be patterned first, and then doped and laser annealed. Comparing these modified processes, the method of first patterning the polysilicon layer 52 has an advantage in that the entire pattern can be recrystallized with a single shot of laser beam. This is because the pattern for an ordinary device, such as a transistor or a diode, is usually so small that the patterned polysilicon layer 52 can be covered by a laser beam spot having a diameter of 30–40 μm, and the laser beam can be shifted from pattern to pattern in accordance with the visible patterned polysilicon layer 52. In contrast, when the recrystallization is done first, the laser spot cannot be positioned by aiming at individual patterns because the polysilicon layer 52 is not patterned until after the recrystallization is finished. This makes it necessary to carefully avoid leaving a border of the recrystallized region on the pattern 52a, since the crystallization is imperfect at the border of the single crystal region 52a.

In the above processes, if the substrate 51 is a SiO₂ layer grown over a silicon substrate (not shown), it is possible to orient the crystal axis of the recrystallized single crystal layer with respect to that of the silicon substrate by exposing the silicon surface at the portion where the single crystal layer 52a should be grown. Such exposure of the silicon substrate can be done by removing the SiO₂ layer 51 using photolithographic patterning.

Figure 5C:
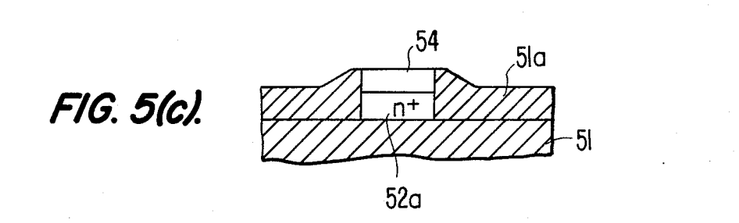
Figure 5D:
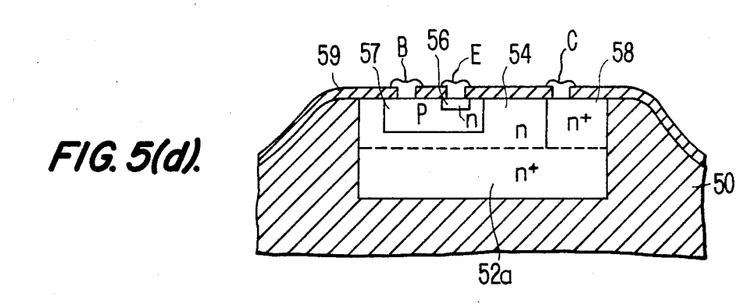

Referring to FIG. 5(c), a second single crystal layer 54 is grown on the first single crystal layer 52a by CVD or an epitaxial growth method, and the region around the first and second single crystal layers 52a and 54 is coated by a second SiO₂ layer 51a in a manner similar to that described above with respect to FIG. 2(d). As a result, the substrate illustrated in FIG. 5(c), which is equivalent to that of FIG. 2(d), is obtained. The second single crystal region 54 is then doped appropriately for the device to be formed. Therefore, as illustrated in FIG. 5(d), a bipolar transistor can be fabricated in the second single crystal silicon region 54, by a conventional method. The second single crystal silicon region 54 is utilized as a collector region, and the first single crystal silicon region 52a is used as a buried layer. In FIG. 5(d), the portion of the substrate including the single crystal silicon regions 52a and 54, is shown in an enlarged view, and SiO₂ layers 51 and 51a are illustrated as a single SiO₂ layer 50. The reference numerals 56, 57, 58 designate the emitter region, base region and collector contact region, respectively. The collector contact region 58 contacts the buried layer 52a, and a bipolar transistor is formed. The symbols E, B and C designate the emitter electrode, base electrode and collector electrode, respectively, and numeral 59 designates a SiO₂ film which is widely used for surface protection. The transistors illustrated in FIG. 2(e) and in FIG. 5(d) have the advantages of a high breakdown voltage and high speed operation compared to ordinary junction isolated transistors, because they are surrounded by an insulator, thereby resulting in a very small stray capacitance.

Figure 5E:
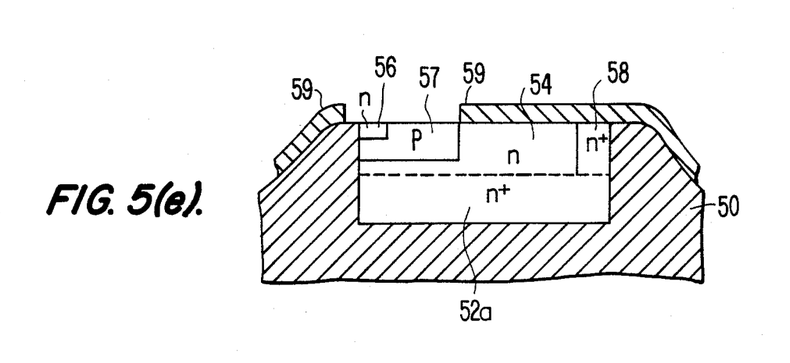

The fabrication of the transistor illustrated in FIG. 5(d) can be modified to use the self-alignment technology which is widely used in the fabrication of fine pattern devices. FIG. 5(e) schematically illustrates the arrangement of the doped regions fabricated by such a self-alignment process. In contrast to FIG. 5(d), in FIG. 5(e) the emitter region 56, the base region 57 and the collector contact region 58 are all aligned to a side edge of the second single crystal region 54. For example, with respect to the base pattern 57, the alignment of a photo-resist mask to form SiO₂ 59 is not as critical as in FIG. 5(d), although the alignment is slightly offset as can be seen in FIG. 5(e). The left side of the base region 57 is aligned automatically (self-aligned) by the edge of the second single crystal region 54. Similarly, the emitter region 56 and the collector contact region 58 are self-aligned. By employing this configuration of the base, emitter and collector contact regions, the mask alignment becomes very simple, and is convenient for fabricating high speed devices which require precise mask alignment.

Figure 6A:
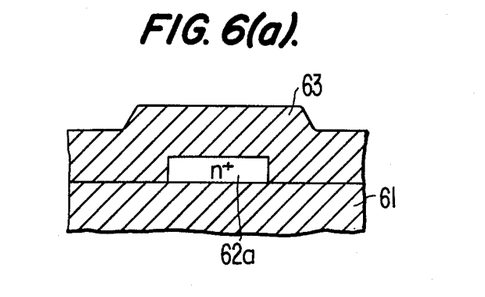

In the third embodiment of the present invention, a single crystal silicon region is formed, which is smaller than the buried layer on which it is formed, thereby avoiding the effect of imperfect crystallization at the border of the recrystallized single crystal silicon region. As illustrated in FIG. 6(a), a single crystal doped buried layer 62a having a thickness of approximately 1 μm, is formed on an insulating layer 61 (this insulating layer may be SiO₂ or sapphire), and is covered by a cap 63 having a thickness of approximately 2 μm. The process for forming this structure is similar to that described with respect to FIGS. 2(a) and 2(b).

Figure 6B:
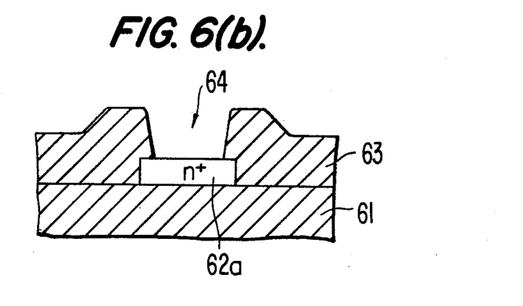

Next, a window 64 is opened in the cap 63, as illustrated in FIG. 6(b). The size of the window 64 is smaller than that of the upper surface of the buried layer 62a, and it is positioned at the center part of the buried layer 62a with enough of a margin to avoid the effects of crystal imperfection which often occur at the border of a crystal.

Figure 6C:
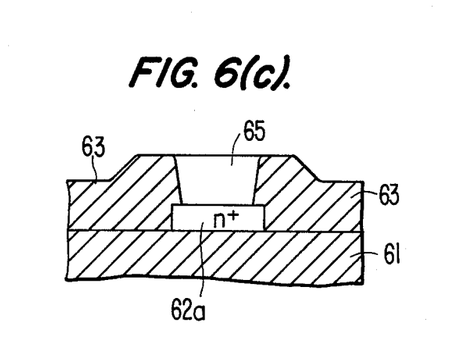

As illustrated in FIG. 6(c), a second single crystal layer 65 is grown in the window 64 by a selective epitaxial growing method which is similar to the method described with respect to FIG. 2(c). The substrate illustrated in FIG. 6(c) is equivalent to that of FIG. 5(c) or FIG. 2(d), and is ready for the fabrication of a transistor. However, compared to the substrates illustrated in FIGS. 2(d) and 5(c), the substrate of this embodiment (FIG. 6(c)) avoids the effects of crystal imperfection at the border of the crystal. Moreover, the advantage of this embodiment is that the cap 63 is left on the substrate, so that it can be utilized later as a surface protective film for the entire device. Therefore, a separate step of fabricating a surface protective film, is eliminated and the process is simplified.

Figure 7A:
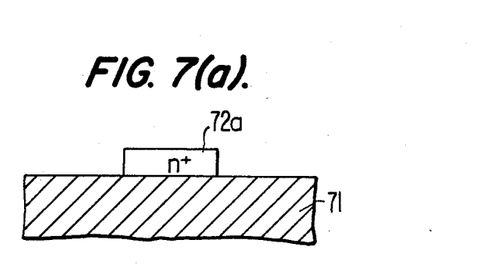
FIGS. 7(a) through 7(d) illustrate the steps of a fourth embodiment of the present invention, for preventing the adverse effects of crystal imperfections, wherein the $SiO_2$ layer around the single crystal region is removed, the side edge of the single crystal is oxidized in clean ambient, and a new $SiO_2$ layer is grown.

In the fourth embodiment of the present invention, the undesirable effects of crystal imperfections at the periphery of recrystallized regions, are also avoided. FIGS. 7(a) through 7(d) are cross-sectional views of a substrate during several of the steps of the process in accordance with the present invention. A first single crystal silicon layer 72a is grown and patterned (using laser recrystallization) on a SiO₂ substrate 71 (or alternatively, a sapphire substrate) having a thickness of approximately 1 μm, as illustrated in FIG. 7(a). The first single crystal layer 72a is doped appropriately for the device to be fabricated. The process used for this is similar to the process which has been described with respect to FIGS. 2 and 5. As a result, a highly doped buried layer 72a is fabricated.

Figure 7B:
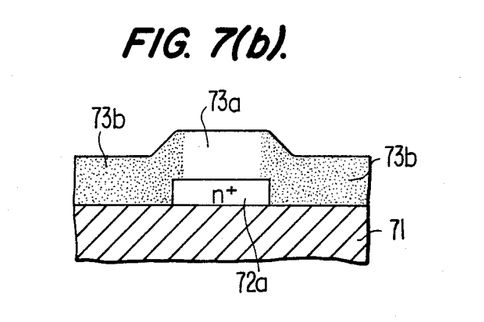

Next, a polysilicon layer having a thickness of 2 μm, is grown over the entire surface by a CVD method. Then, by a selective epitaxial growth process a second single crystal layer 73a is grown over the first single crystal layer 72a, and a polysilicon layer 73b is grown over the remaining surface, as shown in FIG. 7(b).

Figure 7C:
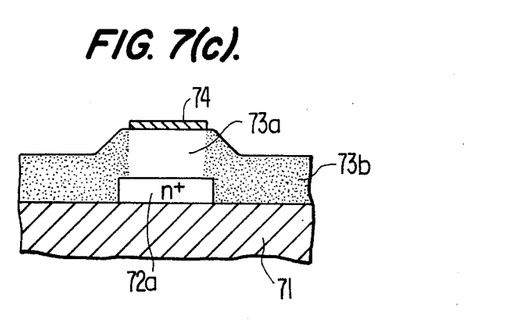

Next, the entire surface is coated with a silicon nitride film 74 having a thickness of 2,000 Å and formed as illustrated in FIG. 7(c). The Si₃N₄ film 74 is patterned so as to exist only over the first single crystal layer 72a, and its size is smaller than that of the first single crystal layer 72a. This patterning is intended to exclude the imperfect crystal portion located on the boundary of the recrystallized first single crystal layer 72a. Usually, it is sufficient to pattern the Si₃N₄ film 74 so that the periphery of the Si₃N₄ film is approximately 0.5–1 μm inside the border of the first single crystal layer 72a. This has the simultaneous effect of improving the tolerance for mask alignment.

Figure 7D:
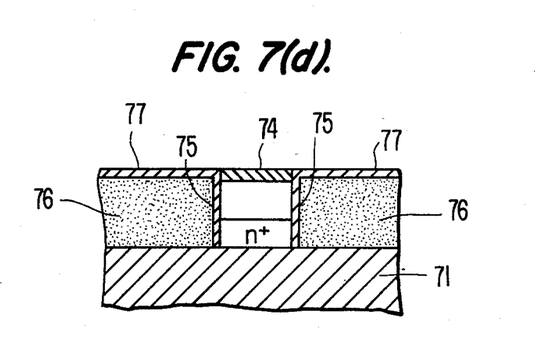

As illustrated in FIG. 7(c) and FIG. 7(d), the polysilicon layer 73b around the first and second single crystal layers 72a and 73a, is etched off by a mixture of hydrofluoric acid and nitric acid in a volume ratio of 100:1, for example, using the Si₃N₄ film 74 as a mask, thereby exposing the side wall of the single crystal regions 72a and 73a. The etching rates of polysilicon and SiO₂ are different, so that the etching is readily controlled to maintain the SiO₂ substrate 71 unetched. Through this etching process, the exposed side wall of the first and second single crystal layers 72a and 73a is also etched (although the etching speed for polysilicon is much faster than that for single crystal silicon), and the crystal imperfection is removed. The side wall is again oxidized, and a SiO₂ film 75 having a thickness of approximately 4,000 Å, is formed around the exposed side wall, by wet oxidation. Then a polysilicon layer 76 is grown over the entire surface of the substrate. The surface of the substrate is polished to expose the Si₃N₄ film 74, the surface of the polysilicon layer 76 is oxidized again, and a new silicon dioxide film 77 having a thickness of about 1,000 Å, is formed. As a result, the substrate has the form illustrated in FIG. 7(d).

Finally, the Si₃N₄ film 74 is removed (the Si₃N₄ film is used as a surface protection film until the last stage), so that the substrate of FIG. 7(d) becomes equivalent to those illustrated in FIG. 2(d) or FIG. 5(c). Therefore, various types of devices can be fabricated using the first and second single crystal layers 72a and 73a. As mentioned above, the first and second single crystal layers 72a and 73a have their boundaries etched off, so that any crystal imperfections are removed. Thus, this embodiment is especially applicable to fabrication of a self-aligned device as has been described above with respect to FIG. 5(e).

As has been described above, the process of the present invention provides a method for fabricating a SOI substrate which is capable of being used in dielectrically isolated ICs, especially for dielectrically isolated bipolar devices. Thus, the process of the present invention is a simplified process for fabricating devices in an isolated region. Further, the process of the present invention provides a SOI substrate in which crystal imperfections have been removed.

The invention has been disclosed with respect to specific embodiments, so that the values set forth in the description should be considered exemplary. Further, the above description has been provided with respect to n⁺-type recrystallization and n-type doping, but it is readily apparent to one skilled in the art that the process could be modified to produce p-type single crystal layers. The basic technologies used in the process are now conventional and are widely used in the art, so that the details of the individual processes (e.g., etching, ion implantation, doping, chemical vapor deposition, oxidation, selective epitaxial growth and photolithographic patterning) are omitted for the sake of brevity. There may occur many modification of the process of the present invention through combination of such technologies, but such modifications are all within the scope of the present invention. For example, the process has been described as using a laser beam for recrystallization, but it can be modified to use any other type of energy beam, such as an electron beam, etc.

The many features and advantages of the present invention are apparent from the detailed specification and thus it is intended by the appended claims to cover all such features and advantages of the system which fall within the true spirit and scope of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed is:

1. A process for fabricating a silicon on insulator (SOI) type semiconductor device, comprising the steps of:
   (a) growing a polysilicon layer on an insulating layer;
   (b) growing a cap layer on the polysilicon layer, the cap layer containing an impurity of a first conductivity type; and
   (c) recrystallizing the polysilicon layer to form a single crystal silicon layer and doping the single crystal silicon layer with the impurity contained in the cap layer by irradiating an energy beam through the cap layer.

2. A process according to claim 1, wherein:
   said step (a) includes the step of patterning the polysilicon layer to form a predetermined pattern; and
   said step (b) includes the step of growing the cap layer over the insulating layer and the patterned polysilicon layer.

3. A process according to claim 1, wherein said step (b) comprises growing a cap layer formed of one of phosphosilicate glass and antimonic glass.

4. A process according to claim 1, further comprising performing the step of forming a mask having openings at predetermined positions on the polysilicon layer prior to said step (b), wherein the recrystallized polysilicon layer is doped selectively through the openings in said step (c).

5. A process according to claim 1, wherein said step (c) comprises irradiating a laser beam through the cap layer.

6. A process according to claim 1, wherein the insulating layer is a silicon dioxide layer.

7. A process according to claim 1, wherein the insulating layer is sapphire.

8. A process for fabricating a silicon on insulator (SOI) type semiconductor device, comprising the steps of:
   (a) fabricating a first single crystal layer on a first insulating layer, the first single crystal layer having a patterned island-like shape with a boundary, and having a first conductivity type;
   (b) depositing silicon on the exposed portion of the first insulating layer and the first single crystal layer, and growing a polysilicon layer and a second single crystal layer having a boundary on the exposed portion of the first insulating layer and the first single crystal layer, respectively;
   (c) forming a second insulating layer on the first insulating layer in place of the polysilicon layer and adjacent the boundaries of the first and second single crystal layers;
   (d) forming a base region in the second single crystal layer, the base region having a second conductivity type which is opposite to the first conductivity type; and
   (e) forming an emitter region in the base region, the emitter region having the first conductivity type.

9. A process according to claim 8, further comprising performing the step of etching the portion of the polysilicon layer surrounding the first and second single crystal layers prior to said step (c).

10. A process according to claim 8, wherein the insulating layer is a silicon dioxide layer.

11. A process according to claim 8, wherein the insulating layer is sapphire.

12. A process for fabricating a silicon on insulator (SOI) type semiconductor device, comprising the steps of:
    (a) fabricating a first polysilicon layer on an insulating layer, the first polysilicon layer having a patterned island-like shape, and having a first conductivity type;
    (b) forming a cap layer of an insulating material over the insulating layer and the first polysilicon layer;
    (c) recrystallizing the first polysilicon layer by irradiating an energy beam through the cap layer, to form a first single crystal silicon layer;
    (d) forming a window in the cap layer and exposing the first single crystal silicon layer through the window;
    (e) forming a second single crystal silicon layer over the first single crystal silicon layer in the window;
    (f) forming a base region in the second single crystal silicon layer; and
    (g) forming an emitter region in the base region.

13. A process according to claim 12, wherein said step (c) comprises irradiating a laser beam.

14. A process according to claim 12, wherein said step (d) comprises forming the window so that the window has a smaller area than the area of the first single crystal silicon layer, and positioning the window in the center portion of the first single crystal silicon layer.

15. A process according to claim 12, wherein the insulating layer is a silicon dioxide layer.

16. A process according to claim 12, wherein the insulating layer is sapphire.

17. A process for forming a semiconductor device, comprising the steps of:
    (a) forming a first single crystal layer on a first insulating layer, the first single crystal layer having a patterned island-like shape with a periphery, and having a first conductivity type;
    (b) forming a second single crystal layer with a periphery on at least a portion of the first single crystal layer;
    (c) forming a second insulating layer on the exposed portion of the first insulating layer adjacent the peripheries of the first and second single crystal layers; and (d) selectively doping the second single crystal layer to form a semiconductor element in the second single crystal layer.

18. A process as set forth in claim 17, wherein said step (a) comprises the substeps of:
 (a') forming a polysilicon layer having a patterned island-like shape on the first insulating layer;
 (a'') forming a cap layer on the polysilicon layer, the cap layer containing an impurity of the first conductivity type; and
 (a''') irradiating an energy beam through the cap layer to recrystallize the polysilicon layer and to dope the polysilicon layer with the impurity contained in the cap layer, thereby forming the first single crystal layer.

19. A process as set forth in claim 18, wherein the first single crystal layer is employed as a buried layer, and wherein said step (d) comprises the substeps of:
 (d') forming a base region in the second single crystal layer, the base region having a second conductivity type which is opposite to the first conductivity type; and
 (d'') forming an emitter region in the base region, the emitter region having the first conductivity type.

20. A process as set forth in claim 17, further comprising the steps of:
 growing a polysilicon layer on the exposed portion of the first insulating layer after said step (a); and
 etching the portion of the polysilicon layer adjacent the peripheries of the first and second single crystal layers prior to said step (c).

21. A process as set forth in claim 20, wherein said step (a) comprises the substeps of:
 (a') forming a polysilicon layer having a patterned island-like shape on the first insulating layer;
 (a'') forming a cap layer on the polysilicon layer, the cap layer containing an impurity of the first conductivity type; and
 (a''') irradiating an energy beam through the cap layer to recrystallize the polysilicon layer and to dope the polysilicon layer with the impurity contained in the cap layer, thereby forming the first single crystal layer.

22. A process as set forth in claim 17, wherein said step (c) comprises forming the second single crystal layer in the center portion of the first single crystal layer, so that the periphery of the second single crystal layer is inset from the periphery of the first single crystal layer.

* * * * *